US006990505B2

(12) United States Patent
Ahmed

(10) Patent No.: US 6,990,505 B2
(45) Date of Patent: Jan. 24, 2006

(54) METHOD/APPARATUS FOR CONVERSION OF HIGHER ORDER BITS OF 64-BIT INTEGER TO FLOATING POINT USING 53-BIT ADDER HARDWARE

(75) Inventor: Sadar Ahmed, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 601 days.

(21) Appl. No.: 10/142,237

(22) Filed: May 9, 2002

(65) Prior Publication Data

US 2003/0212720 A1 Nov. 13, 2003

(51) Int. Cl.
*G06F 7/00* (2006.01)
(52) U.S. Cl. ....................... 708/204; 708/495
(58) Field of Classification Search .............. 708/204, 708/495
See application file for complete search history.

(56) References Cited

U.S. PATENT DOCUMENTS

| 5,432,727 | A | 7/1995 | Ahmed | 314/748 |
| 6,131,104 | A | 10/2000 | Oberman | 708/204 |
| 6,282,554 | B1 * | 8/2001 | Abdallah et al. | 708/204 |
| 6,301,594 | B1 | 10/2001 | Ahmed | 708/205 |
| 6,397,239 | B2 * | 5/2002 | Oberman et al. | 708/495 |

* cited by examiner

*Primary Examiner*—Tan V. Mai
(74) *Attorney, Agent, or Firm*—Osha Liang LLP

(57) ABSTRACT

A floating point unit capable of converting a 64-bit integer number to a floating point format is provided. The floating point unit includes an 11-bit zero/one complement detect circuitry in an exponent datapath of the floating point unit, where the 11-bit zero/one complement detect circuitry is used to determine a shift count for a right shifter in a large exponent difference mantissa datapath of the floating point unit. The 11-bit zero/one complement detect circuitry determines shift counts based on particular bit groupings of the 64-bit operand.

7 Claims, 6 Drawing Sheets

US 6,990,505 B2

METHOD/APPARATUS FOR CONVERSION OF HIGHER ORDER BITS OF 64-BIT INTEGER TO FLOATING POINT USING 53-BIT ADDER HARDWARE

BACKGROUND OF INVENTION

Numbers may be represented within a computer system in a variety of ways. In an extended integer format, for example, a 64-bit register may store numbers ranging from 0 to $2^{63}-1$ (the same size register may also store signed numbers by giving up one order of magnitude in range). This format is limiting, however, because it is incapable of representing numbers that are not integers (i.e., numbers that do not have a binary point to the right of the least significant bit in the register).

To accommodate non-integer numbers, a fixed point representation may be used. In this form of representation, the binary point is considered to be somewhere other than to the right of the least significant bit. For example, a 64-bit register may be used to store values from 0 (inclusive) to 2 (exclusive) by processing register values as though the binary point is located to the right of the most significant register bit. Such a representation allows, in the example, 63 register bits to represent fractional values. In other implementations, one bit may be used as a sign bit so that a register can store values between −2 and +2.

Because the binary point is fixed within a register or storage location during fixed point arithmetic operations, numbers with differing orders of magnitude may not be represented with equal precision without scaling. For example, it is not possible to represent both 1001b (13 in decimal) and 0.1101b (0.8125 in decimal) using the same fixed point representation. While fixed point representation schemes are still quite useful, many applications require a larger dynamic range (i.e., the ratio of the largest number representation to the smallest, non-zero, number representation in a given format).

In order to solve this problem of limited dynamic range, floating point representation and arithmetic is widely used. Generally speaking, floating point representations include three parts: a sign bit, and unsigned fractional number (i.e., the mantissa), and an exponent value. One example of a floating point representation format commonly used, IEEE standard 754, is depicted in FIG. 1.

Referring to FIG. 1, a floating point representation format 2 is shown. Format 2 includes a sign bit (denoted as S) 4, an exponent portion (denoted as E) 6, and a mantissa portion (denoted as F) 8. Floating point values represented in this format have a value V, where $V=(-1)^S \times 2^{E-bias} \times (1.F)$. Sign bit S represents the sign of the entire number, while mantissa portion F is a 52-bit number with an implied leading 1 bit (values with a leading one bit are said to be "normalized"). In other implementations, the leading one bit may be explicit. Exponent portion E is an 11-bit value that represents the true exponent of the number V offset by a predetermined bias. A bias is used so that both positive and negative true exponents may be easily compared. The number 127 is used as the bias in IEEE standard 754. Format 2 may thus accommodate numbers having exponents from −1023 to +1024. Floating point format 2 advantageously allows 53 bits of representation within each of these orders of magnitude.

Floating point addition is an extremely common operation in numerically intensive applications (floating point subtraction is accomplished by complementing one of the inputs and performing addition). Although floating point addition is related to fixed point addition, two differences cause complications. First, an exponent value of the results must be determined from the input operands. Secondly, rounding must be performed. The IEEE standard specifies that the result of an operation should be the same as is the result were computed exactly, and then rounded (to a predetermined number of digits) using the current rounding mode. IEEE standard 754 specifies four rounding modes: round to nearest, round to zero, round to +∞, and round to −∞. The default mode, round to nearest, chooses the even number in the event of a tie.

Referring to FIG. 2, a flow process of a typical floating point unit 10 is shown. All stages in the floating point unit 10 are not performed for all possible additions (i.e., some steps are optional depending on the inputs and user commands). The stages of the floating point unit 10 are described below with reference to input values A and B. Input value A has a sign bit $A_S$, an exponent value $A_E$, and a mantissa value $A_F$. Input value B has a sign bit $B_S$, an exponent value $B_E$, and a mantissa value $B_F$.

The floating point unit 10 first includes a stage 12, in which an exponent difference $E_{diff}$ is calculated between $A_E$ and $B_E$. In some implementations, if $E_{diff}$ is calculated to be negative, operands A and B are switched such that A becomes the larger operand. In the implementation of FIG. 2, the operands are switched such that $E_{diff}$ is always positive.

In stage 14, operand A is aligned. This is accomplished by shifting operand B $E_{diff}$ bits to the right. In this manner, the mantissa portions of both operands are scaled to the same order of magnitude. If $A_E=B_E$, no shifting is performed. If $E_{diff}>0$, however, information must be maintained with respect to the bits that are shifted rightward (and are thus no longer representable within the predetermined number of bits). In order to perform IEEE rounding, information is maintained relative to 3 bits: the guard bit (G), the round bit (R), and the sticky bit (S). The guard bit is one bit less significant than the least significant bit (L) of the shifted value, while the round bit is one bit less significant than the guard bit. The sticky bit is the logical-OR of all bits less significant than the round bit. In the final stage of rounding after normalization (described below), the bit next to the least significant bit of the result becomes the round bit (R) and the bit after this is the sticky bit (S).

In stage 16, the shifted version of operand B is complemented, if needed, to perform subtraction. In some implementations, the signs of the input operands and the desired operation are examined in order to determined whether effective addition or effective subtraction is occurring. In one implementation, effective addition, EA, is given by $EA=A_S \oplus B_S \oplus op$, where op is 0 for addition and 1 for subtraction. For example, the operation A minus B, where B is negative, is equivalent to A plus B (ignoring the sign bit of B). Therefore, effective addition is performed. The complementation in stage 16 may be either of the one's complement or two's complement variety.

In stage 18, the addition of operand A and operand B is performed. As described above, operand B may be shifted and complemented as needed. Subsequently, in stage 22, the result of stage 18 is normalized. This includes left-shifting the result of stage 18 until the most significant bit is a 1. The bits that are shifted in are calculated according to the values of result, G, and R. In stage 24, the normalized value is rounded according to nearest rounding mode. If S includes the R bit OR'ed in, round to nearest, RTN, is given by RTN=G(L+S). If the rounding performed in stage 24 produces an overflow, the result is post-normalized (right-shifted) in stage 26.

As can be seen from the description of the floating point unit 10, floating point operations are quite complicated. However, because floating point operations provide for a larger dynamic range than integer and fixed point numbers, conversion among the various formats is often necessary. For example, most architectural schemes include operations for converting an integer number to a floating point number. Accordingly, the conversion from integer format to floating point format is typically done in a floating point unit. However, because large integer formats require large zero/one detect logic and large shifting logic, some of the conversion takes place in software after the floating point unit issues an unfinished trap signal. In some implementations, such a potential performance problem may be solved using a separate convert datapath that can accommodate larger bit representation formats and logic. However, implementation of such a convert datapath requires substantial amounts of extra hardware and increases cycle time.

SUMMARY OF INVENTION

According to one aspect of the present invention, an integrated circuit comprises a floating point unit arranged to receive a first operand having an integer value and to output a floating point value, where the floating point unit comprises: a small exponent difference datapath arranged to receive a first portion of the first operand; a large exponent difference datapath arranged to receive the first portion of the first operand; and an exponent datapath arranged to receive a second portion of the first operand, the exponent datapath comprising n-bit zero/one complement detect circuitry that is used to determine a shift count based on an n-bit group in the first operand, where the large exponent difference datapath outputs a portion of the floating point value dependent on the shift count.

According to another aspect, an integrated circuit comprises adder means for receiving a first operand having an integer value and outputting a floating point value, where the adder means comprises: first datapath means for receiving a first portion of the first operand; second datapath means for receiving the first portion of the first operand; and exponent datapath means for receiving a n-bit portion of the first operand, the exponent datapath means comprising n-bit zero/one complement detect circuitry that is used to determine a shift count based on the n-bit portion, where the second datapath means outputs a portion of the floating point value dependent on the shift count.

According to another aspect, a method for converting an operand having integer value to a floating point value comprises inputting a first portion of the integer value into a first datapath, inputting a n-bit portion of the integer value into a second datapath, determining a shift count based on the n-bit portion, and outputting from the first datapath a portion of the floating point value dependent on the shift count.

According to another aspect, an integrated circuit comprises a 64-bit floating point adder arranged to receive a 64-bit operand, where the 64-bit floating point adder comprises: a small exponent difference datapath arranged to receive a 52-bit portion of the 64-bit operand; a large exponent difference datapath arranged to receive a 53-bit portion of the 64-bit operand; and an exponent datapath arranged to receive an 11-bit portion of the 64-bit operand, the exponent datapath comprising 11-bit zero/one complement detect circuitry that is used to output a shift count based on the 11-bit portion, where the large exponent difference datapath outputs a portion of a 64-bit output from the 64-bit floating point adder dependent on the shift count.

Other aspects and advantages of the invention will be apparent from the following description and the appended claims.

DETAILED DESCRIPTION

Embodiments of the present invention relate to an integrated circuit having a floating point unit that is capable of integer to floating point conversion. Embodiments of the present invention further relate to a method for conducting 64-bit integer to floating point conversion using an addition of minimal hardware to a floating point unit.

Figure 1:
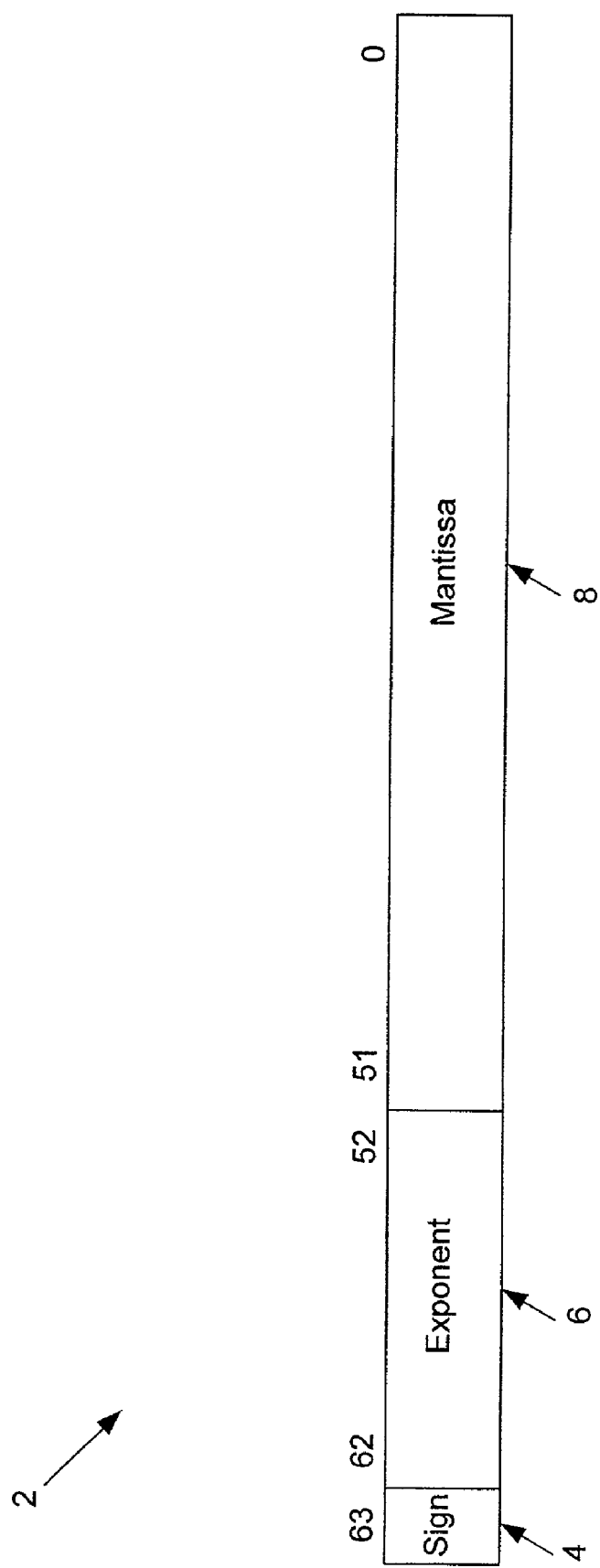
FIG. 1 shows a typical floating point representation format.
Figure 2:
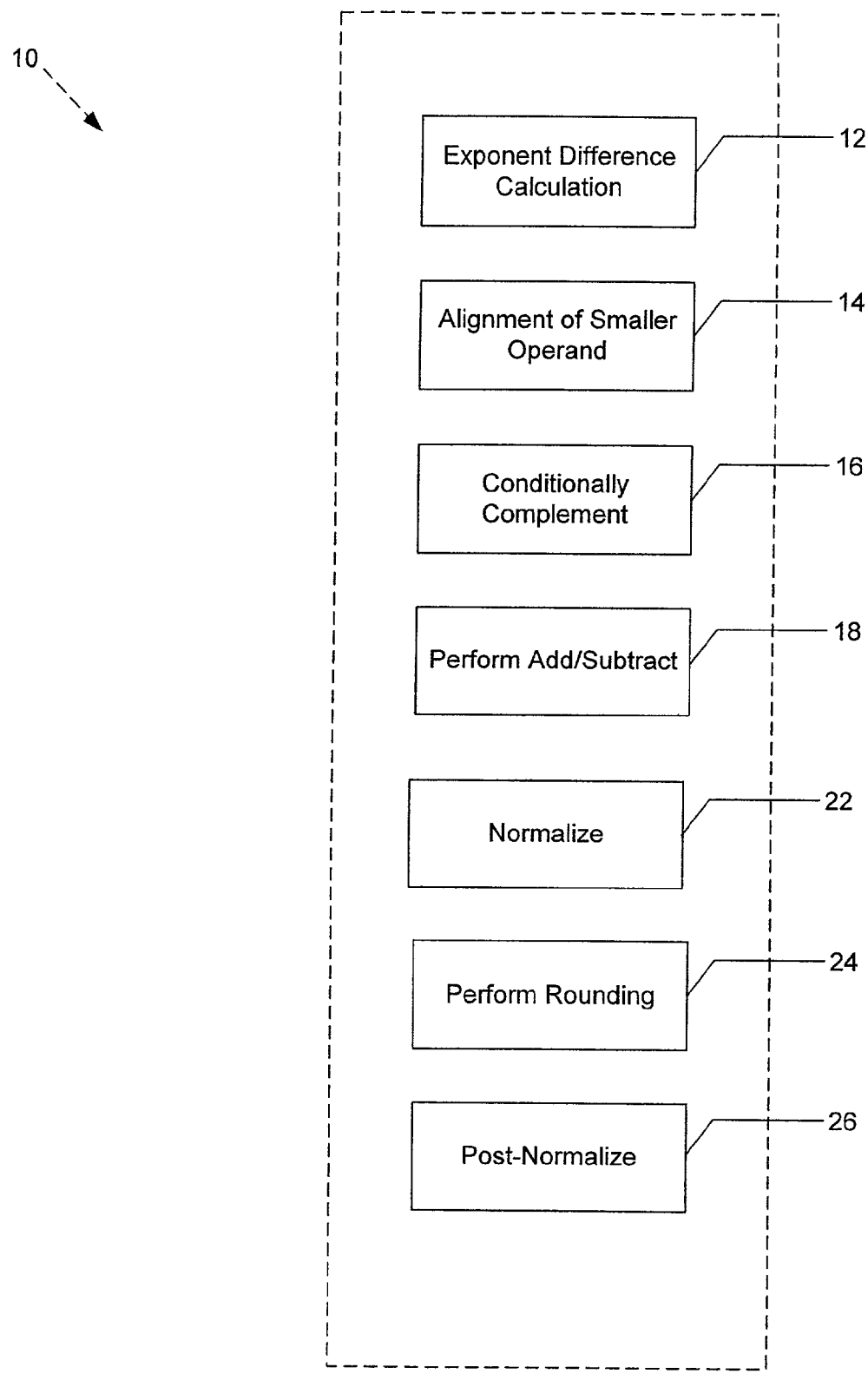
FIG. 2 shows a typical floating point unit flow process.
Figure 3:
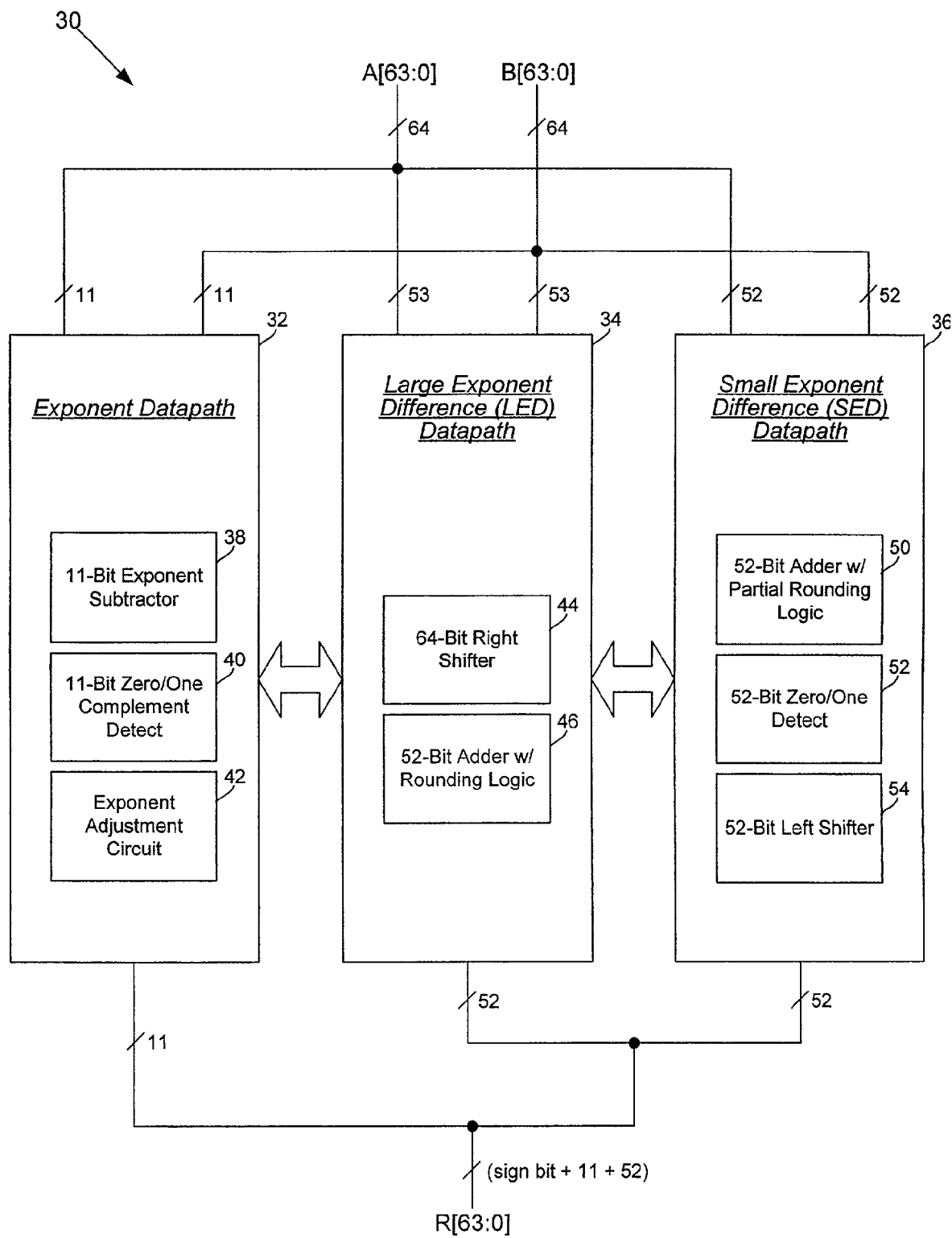
FIG. 3 shows a floating point unit in accordance with an embodiment of the present invention.

FIG. 3 shows an exemplary floating point unit 30 in accordance with an embodiment of the present invention. The floating point unit 30 performs two types of operations: (1) the addition/subtraction of two floating-point operands A[63:0] and B[63:0] (normal mode) and (2) the conversion of a number between an integer/extended integer format and a floating-point format (convert mode). The floating point unit 30 outputs a normalized double-precision floating point results R[63:0].

The floating point unit 30 includes a Large Exponent Difference (LED) mantissa datapath 34, a Small Exponent Difference (SED) mantissa datapath 36, and an exponent datapath 32. Because the concept of LED and SED mantissa datapaths is generally known in the art, the description of the mantissa datapaths will be limited to those aspects directly pertinent to the present invention. In a normal mode, the LED and SED mantissa datapaths 34 and 36 are arranged to receive the mantissas A[51:0] and B[51:0] and generate the mantissa R[51:0]. The LED mantissa datapath 34 operates on floating point operands whose exponents differ by an amount greater than one. The SED mantissa datapath 36 operates on floating point operands whose exponents differ by one or less. In a normal mode, the exponent datapath 32 receives the exponents A[62:52] and B[62:52] to generate the 11-bit exponent R[62:52].

The exponent datapath 32 includes an 11-bit exponent subtractor 38 that is used to determined the difference in exponents between exponents A[62:52] and B[62:52], an 11-bit zero/one complement detect 40 that is used during conversion operations (discussed below with reference to FIG. 4), and an exponent adjustment circuit 42 that is used to adjust an exponent of an unnormalized floating point result to generate an exponent of the normalized result R.

The LED mantissa datapath 34 includes a 64-bit right shifter 44 (discussed below with reference to FIG. 5b), a 52-bit adder having rounding logic 46 that is used to add the mantissas A[51:0] and B[51:0] when the LED mantissa datapath 34 is used during a normal mode. The SED mantissa datapath 36 includes a 52-bit adder having partial rounding logic 50 that is used to add the mantissas A[51:0] and B[51:0] when the SED mantissa datapath 36 is used during a normal mode, a 52-bit one/zero detect 52, a 52-bit left shifter 54.

Figure 4:
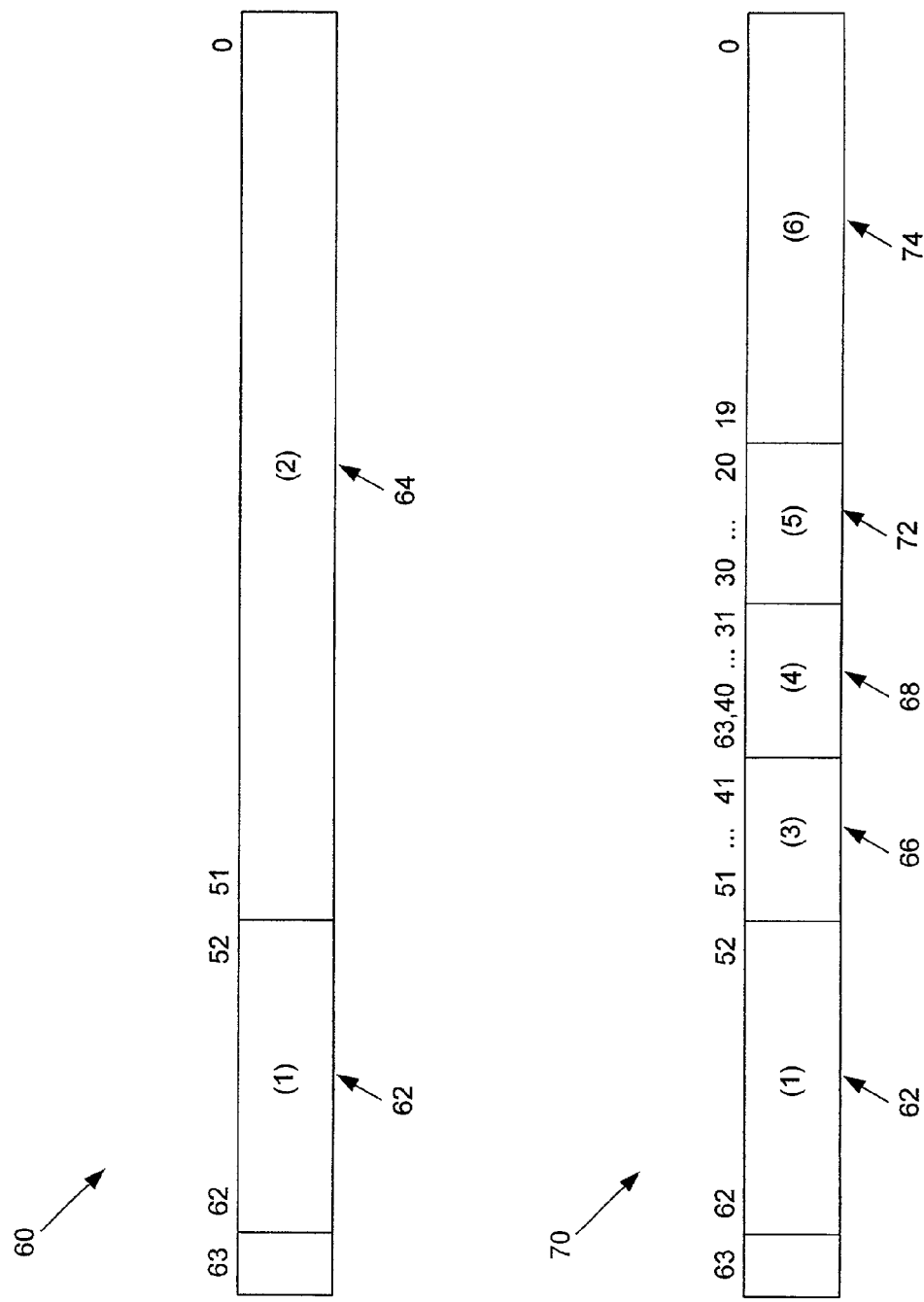
FIG. 4 shows numerical formats in accordance with an embodiment of the present invention.

In a convert mode, i.e., when the floating point is used to convert an integer or extended integer format input to a floating point format, bits in the integer format are grouped as shown in FIG. 4 depending on whether the integer number is being converted to a single precision floating point format 60 or a double precision floating point format 70. The SED mantissa datapath 36 is used for groups (2) 64 and (6) 74 and is not part of the scope of the present invention. The LED mantissa datapath 34 is used for groups (1) 62, (3) 66, (4) 68, and (5) 70 and directly pertains to the present invention. As shown in FIG. 4, groups (1) 62, (3) 66, (4) 68, and (5) 70 are 11-bit groups. The 11-bit zero/one complement detect 40 in the exponent datapath 32 is arranged to receive the 11-bit groups, count the number of zeroes or ones in each group and complement the count. The complemented count of each 11-bit group is the shift count that is used to determine how many bit places the 64-bit right shifter 44 in the LED mantissa datapath 34 needs to shift. For example, an 11-bit group having a value of 1111110xxxx has 6 consecutive ones, which is represented by a complemented shift count of 101.

Figure 5A:
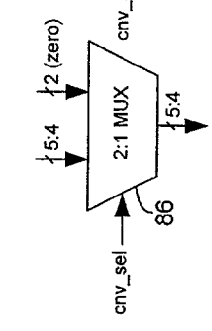
FIG. 5a shows a portion of the floating point unit shown in FIG. 3.
Figure 5A:
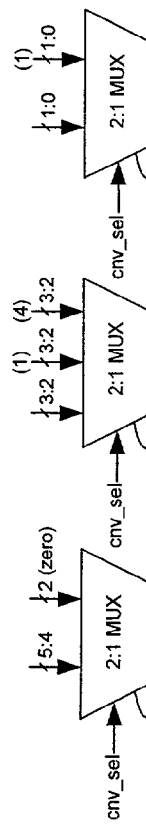

As shown in FIG. 5a, the complemented shift counts of groups (1) 62, (3) 66, (4) 68, and (5) 70 are multiplexed with normal mode values. Depending on a convert select signal cnv_sel to multiplexors 80, 82, 84, 86, 88, and 90, multiplexors 80, 82, 84, 86, 88, and 90 respectively output bits of a normal mode shift count or particular bits of the complemented shift counts generated by the 11-bit zero/one complement detect 40 in the exponent datapath 32.

Figure 5B:
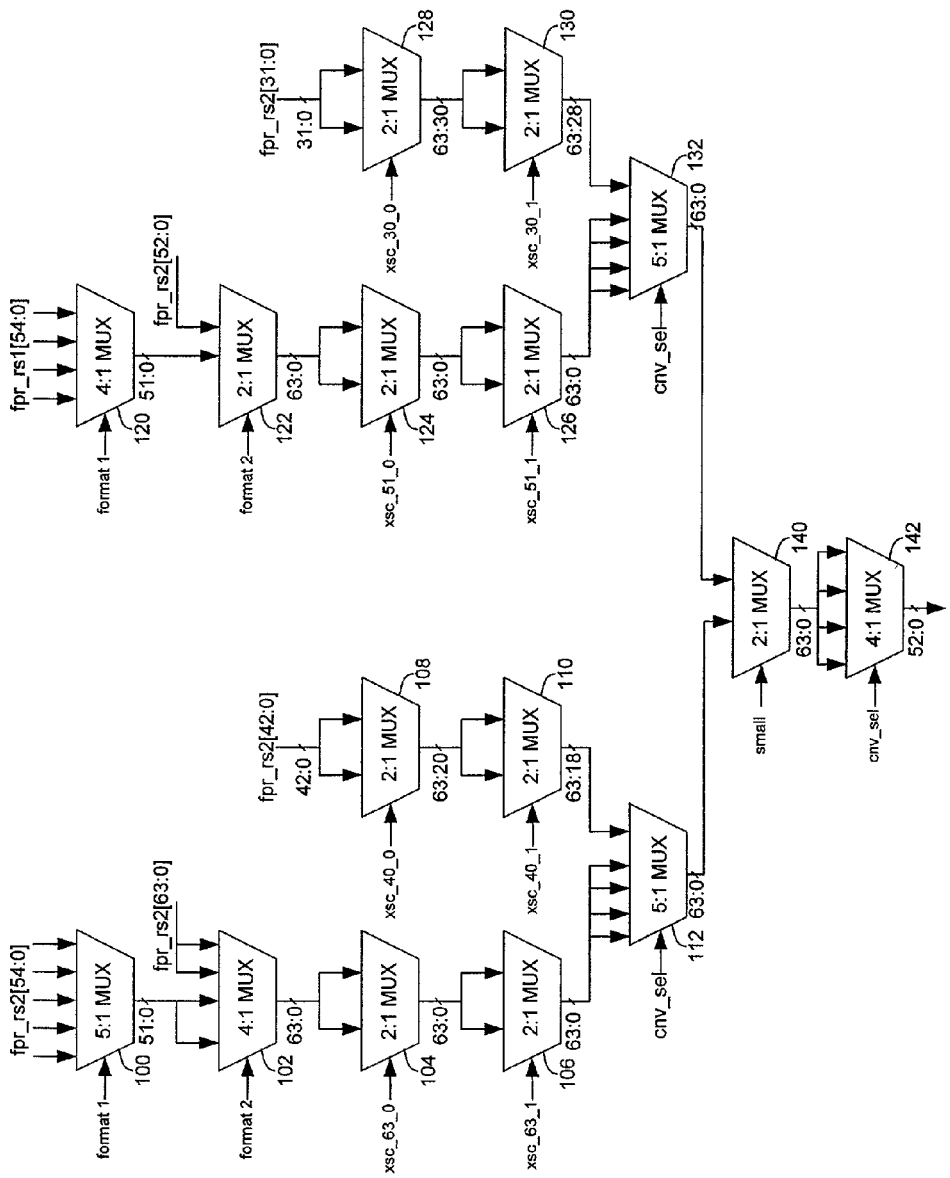
FIG. 5b shows a portion of the floating point unit shown in FIG. 3.

As shown in FIG. 5b, the output from multiplexors 80, 82, 84, 86, 88, and 90 is used to determine how to merge register data in the 64-bit right shifter 44 in the LED mantissa datapath 34. Those skilled in the art will understand that by determining the shift counts of the bit groups shown in FIG. 4, a value from a source register, i.e., a register containing the value of the operand being converted, is formatted and merged so as to yield a floating point value. Multiplexors 100, 102, 104, 106, 108, 110, and 112 are used in a first partition of the 64-bit right shifter 44 and multiplexors 120, 122, 124, 126, 128, 130, and 132 are used in a second partition of the 64-bit right shifter 44. By using the shift counts discussed above with reference to FIGS. 4 and 5a, particular data is multiplexed so as to merge initially integer-type data within a register to yield a number in a floating point format. The outputs from the first and second partitions of the 64-bit right shifter 44 are multiplexed further using multiplexors 140 and 142, where multiplexor 142 outputs a final mantissa portion of the floating point number converted from the integer number.

Advantages of the present invention may include one or more of the following. In some embodiments, because a floating point unit may be used to convert a 64-bit number in an integer format to a floating point format without the implementation of a separate convert datapath, hardware circuitry needed for conversion may be minimized.

In some embodiments, because a floating point unit may be used to convert a 64-bit number in an integer format to a floating point format without the implementation of a separate convert datapath, cycle time required for conversion may be minimized.

In some embodiments, because a floating point unit may efficiently convert an integer to a floating point, higher precision arithmetical operations may be realized.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
 a floating point unit arranged to receive a first operand having an integer value and to output a floating point value, the floating point unit comprising:
  a small exponent difference datapath arranged to receive a first portion of the first operand,
  a large exponent difference datapath arranged to receive the first portion of the first operand, and
  an exponent datapath arranged to receive a second portion of the first operand, the exponent datapath comprising n-bit zero/one complement detect circuitry that is used to determine a shift count based on an n-bit group in the first operand,
 wherein the large exponent difference datapath outputs a portion of the floating point value dependent on the shift count.

2. The integrated circuit of claim 1, the large exponent difference datapath comprising a right shifter, wherein the large exponent difference datapath is arranged to receive the shift count, wherein the shift count is used by the large exponent difference datapath to determine how many bit places the right shifter is to be shifted.

3. The integrated circuit of claim 1, further comprising:
 circuitry that multiplexes the shift count and a normal mode value, wherein an output of the circuitry is used to selectively merge register data in the right shifter.

4. The integrated circuit of claim 1, wherein a register containing the value of the first operand is formatted and merged dependent on the shift count to yield the portion of the floating point value.

5. An integrated circuit, comprising:
 adder means for receiving a first operand having an integer value and outputting a floating point value, the adder means comprising:
  first datapath means for receiving a first portion of the first operand,
  second datapath means for receiving the first portion of the first operand, and
  exponent datapath means for receiving a n-bit portion of the first operand, the exponent datapath means comprising n-bit zero/one complement detect circuitry that is used to determine a shift count based on the n-bit portion,
 wherein the second datapath means outputs a portion of the floating point value dependent on the shift count.

6. An integrated circuit, comprising:
 a 64-bit floating point adder arranged to receive a 64-bit operand, the 64-bit floating point adder comprising:
  a small exponent difference datapath arranged to receive a 52-bit portion of the 64-bit operand, a large exponent difference datapath arranged to receive a 53-bit portion of the 64-bit operand, and an exponent datapath arranged to receive an 11-bit portion of the 64-bit operand, the exponent datapath comprising 11-bit zero/one complement detect circuitry that is used to output a shift count based on the 11-bit portion, wherein the large exponent difference datapath outputs a portion of a 64-bit output from the 64-bit floating point adder dependent on the shift count.

7. The integrated circuit of claim 6, the large exponent difference datapath comprising a 64-bit right shifter, wherein the large exponent difference datapath is arranged to receive the shift count, wherein the shift count is used by the large exponent difference datapath to determine how many bit places the 64-bit right shifter is to be shifted.

* * * * *